US005989931A

United States Patent [19]

Ghodsian et al.

[11] Patent Number: 5,989,931

[45] Date of Patent: Nov. 23, 1999

[54] LOW-COST METHODS FOR MANUFACTURING FIELD IONIZATION AND EMISSION STRUCTURES WITH SELF-ALIGNED GATE ELECTRODES

[75] Inventors: Bahram Ghodsian, West Vancouver; Ash M. Parameswaran, Port Moody; Marek Syrzycki, Coquitlam, all of Canada

[73] Assignee: Simon Fraser University, Burnaby, Canada

[21] Appl. No.: 08/936,766

[22] Filed: Sep. 24, 1997

[51] Int. Cl.[6] .......... H01L 21/00

[52] U.S. Cl. .......... 438/20; 438/34; 445/24

[58] Field of Search .......... 438/20; 257/10; 445/24, 50

[56] References Cited

U.S. PATENT DOCUMENTS

| | | | |
|---|---|---|---|
| 4,307,507 | 12/1981 | Gray et al. . | |
| 4,916,002 | 4/1990 | Carver . | |
| 5,100,355 | 3/1992 | Marcus et al. | 445/24 |
| 5,221,221 | 6/1993 | Okaniwa | 445/24 |
| 5,334,908 | 8/1994 | Zimmerman . | |
| 5,367,181 | 11/1994 | Yoshida | 257/91 |
| 5,393,647 | 2/1995 | Neukermans et al. . | |
| 5,483,118 | 1/1996 | Nakamoto et al. . | |
| 5,580,827 | 12/1996 | Akamine . | |
| 5,727,976 | 3/1998 | Nakamoto et al. | 445/24 |
| 5,885,124 | 3/1999 | Hattori | 445/24 |

OTHER PUBLICATIONS

Spindt, C.A., "A Thin–Film Field–Emission Cathode", Communication, p. 3504–?.

*Primary Examiner*—Tuan H. Nguyen
*Attorney, Agent, or Firm*—Oyen Wiggs Green & Mutala

[57] ABSTRACT

Methods for forming field emission and/or field ionization structures with self-aligned gate electrode structures involve forming a cavity in a first face of a substrate and forming an oxide layer in the cavity. The oxide layer forms a mold for making a sharp field emission tip which will be exposed on a second face of the substrate. In a first method a gate electrode is formed in the substrate. The gate electrode is automatically spaced apart from and insulated from the tip by the oxide layer. The gate electrode may comprise a doped region in the substrate. In a variant method, a gate electrode is formed in a thin metal film deposited on the second face of the substrate. A photoresist mask is created by shining ultraviolet light on the first face of the substrate to expose the underside of a layer of photoresist deposited on the metal film in an area adjacent the tip mold. The mask is automatically aligned with the tip mold.

26 Claims, 10 Drawing Sheets

LOW-COST METHODS FOR MANUFACTURING FIELD IONIZATION AND EMISSION STRUCTURES WITH SELF-ALIGNED GATE ELECTRODES

TECHNICAL FIELD

This invention relates to field ionization and emission structures and to methods for fabricating field ionization and emission structures.

BACKGROUND

In recent years there has been a growing interest in replacing inefficient thermionic cathodes in electronic devices with much more efficient high field emission structures. A thermionic cathode causes electrons to be emitted from a cathode surface by raising the cathode surface to a very high temperature, either by passing a high electrical current through the cathode itself or through the use of a separate heater. Thermionic emission is very inefficient. Most of the energy is wasted as heat.

Field ionization and emission structures can emit electrons without being maintained at high temperatures. There are many potential applications for such structures. For example, arrays of field emission structures have been proposed for use as cathodes in flat panel displays, field-ionization type chemical detectors, vacuum microelectronic devices, electron microscopes, and high performance high frequency vacuum tubes.

Field emission structures comprise extremely sharp points (typically less then 100 nanometers in radius) of electrically conductive material. High electric fields may be achieved at the points by applying an electrical potential to the points relative to an adjacent structure. Where the point is negatively charged the electric field at the point can be sufficient to discharge large numbers of electrons from the point. When the point is positively charged then the electric field in the vicinity of the point can be sufficient to ionize gas molecules in contact with the point by causing electrons to tunnel through the potential barrier into the point.

The emission or ionization of a point may be controlled by providing a gate electrode structure adjacent the point and applying an electrical potential to the gate electrode. The effect of the potential on the gate electrode on emission or ionization at the point increases as the distance between the point and the gate electrode is reduced. Minimum gate electrode potentials can most conveniently be obtained by fabricating the gate electrode together with the field ionization and emission structures.

Gray et al., U.S. Pat. No. 4,307,507, describe a method for manufacturing field emission cathode sources. The method involves applying a mask to an oriented wafer of single crystal material and then performing an orientation-dependent etch through holes in the mask to produce pits. The orientation dependent etch produces pits which have a pyramidal shape. The pits are the inverse of the desired shape of the points. The mask is removed and a layer of emission material is deposited to fill the pits and cover the surface of the wafer. The wafer is then etched away to expose pointed replicas of the pits, whose sharp points can be used as field ionization or emitters. The Gray et al. method is simple but it does not provide an integrated gate electrode and the points produced are not as sharp as would be desirable.

Nakamoto et al., U.S. Pat. No. 5,483,118, provides a method for fabricating field emission structures with integrated gate electrodes. The gate electrodes are deposited after field emission points are formed. The Nakamoto et al. methods require several separate masking steps. The requirement to align several masks tends to make to Nakamoto et al. methods expensive. It is especially disadvantageous that the Nakamoto et al. methods require aligning features created by masking on one face of a wafer with masks to mask features on the opposite face of the wafer. Furthermore, the Nakamoto et al. methods use equipment that is expensive and not universally available.

Other micro fabrication methods for making microminiature tips are described in Akamine, U.S. Pat. No. 5,580,827, Carver, U.S. Pat. No. 4,916,002, Zimmerman, U.S. Pat. No. 5,334,908, Neukermans et al., U.S. Pat. No. 5,393,647, and, Spindt *A Thin Film Field-Emission Cathode*, Journal of Applied Physics, V. 47, p. 5248 (1976). Jensen et al., *Analytical and semi numerical models for gated field emitter arrays. I. theory*, J. Vac. Sci. Technol., B 14(3), (May/June 1996) describes the desired relationship between a gate electrode and a field emitter point.

What is needed is a method for fabricating field-emission structures or arrays of field emission structures that can be practised at lower cost than currently known methods. Also needed is a lower cost method for fabricating field-emission structures or arrays of field emission structures which incorporate a gate electrode. In particular, what is needed is a method for forming a field emission point which is aligned in an aperture of a gate electrode without the necessity of precisely aligning a mask. Also needed is a method to fabricate field-emission points which are sharper than those produced by current methods.

SUMMARY OF INVENTION

One object of this invention is to provide methods for forming microminiature tips, individually or in arrays. Another object of the invention is to provide methods for fabricating microminiature tips, or arrays of microminiature tips, having self-aligned gate structures. Another object of the invention is to provide methods for fabricating microminiature tips, or arrays of microminiature tips, which can be practised at lower cost than existing methods.

One aspect of the invention provides a method for forming a microminiature tip and a gate self-aligned with the tip. The method comprises the steps of: providing a substrate of a single crystal substrate material, the substrate having first and second faces and a thickness; forming a prismatic cavity having a sharp point in the first face of the substrate, the cavity point at a first depth below the second face of the substrate; removing substrate material from the second face of the substrate in an area opposed to the cavity to a depth greater than the first depth and less than the thickness of the substrate and forming a tip mold by oxidizing the substrate to form an oxide layer on walls of the cavity; filling the tip mold with a material capable of emitting electrons under the influence of an electric field to yield a tip encased in the oxide layer; and, removing a portion of the oxide layer to expose the tip. The substrate material is preferably silicon.

An integrated self-aligned gate structure may be provided by extending an electrical connection to a gate region of the substrate material surrounding the tip. A region in the substrate material surrounding the tip mold on the second face of the substrate may be doped with a dopant in a concentration sufficient to render the doped area electrically conducting to provide the gate structure.

In a preferred embodiment, the method includes forming a self-aligned gate electrode structure on the second face of the substrate by the steps of: depositing a thin light permeable layer of a conductor on the second face of the substrate; depositing a photoresist on top of the layer of conductor; selectively developing the photoresist by illuminating the first face of the substrate with light to produce an unmasked area coincident with the tip mold; and, removing the conductor in the unmasked area. The conductor may comprise a metal having a thickness in the range of 10 nanometers to 100 nanometers.

Another aspect of the invention provides a method for fabricating a field emission structure in a substrate. The method comprises the steps of: providing a substrate of a single crystal substrate material, the substrate having first and second faces and a thickness; forming a cavity on the first face of the substrate, the cavity penetrating through the substrate to an aperture on the second face of the substrate; placing the substrate in oxidizing conditions until a layer of oxide on the substrate blocks the aperture, the layer of oxide forming a cusped tip mold in the cavity; and filling the tip mold with a material capable of emitting electrons under the influence of an electric field to yield a tip encased in the layer of oxide; and, removing a portion of the layer of oxide to expose the tip on the second face of the substrate.

Yet another aspect of the invention provides a method for fabricating a field emission structure having an integrated gate electrode structure. The method comprises the steps of: providing a wafer of a single crystal substrate material having first and second faces; forming an oxide tip mold in a cavity in the first face of the wafer, the oxide tip mold penetrating the second face of the wafer; applying a conductive film on the second face of the wafer, the film non opaque to electromagnetic radiation of a first frequency; applying a layer of photoresist on the conductive film, the photoresist sensitive to electromagnetic radiation of the first frequency; exposing the photoresist by shining electromagnetic radiation of the first frequency on the first face of the wafer and allowing the electromagnetic radiation to pass through the tip mold and the conductive film to expose a window in the photoresist aligned with the tip mold; removing the conductive film exposed in the window; depositing a conductive material capable of emitting electrons in the tip mold; and, removing a portion of the tip mold to expose a sharp tip of the conductive material. The electromagnetic radiation preferably comprises ultraviolet light. The conductive film may comprise a film of a compatible metal having a thickness in the range of 10 nanometers to 100 nanometers. The conductive material is preferably selected from the group consisting of silicon nitride, polysilicon, aluminum, gold, tungsten and iridium.

BRIEF DESCRIPTION OF DRAWINGS

The invention will now be described with reference to the appended drawings in which.

DESCRIPTION

Figure 1A:
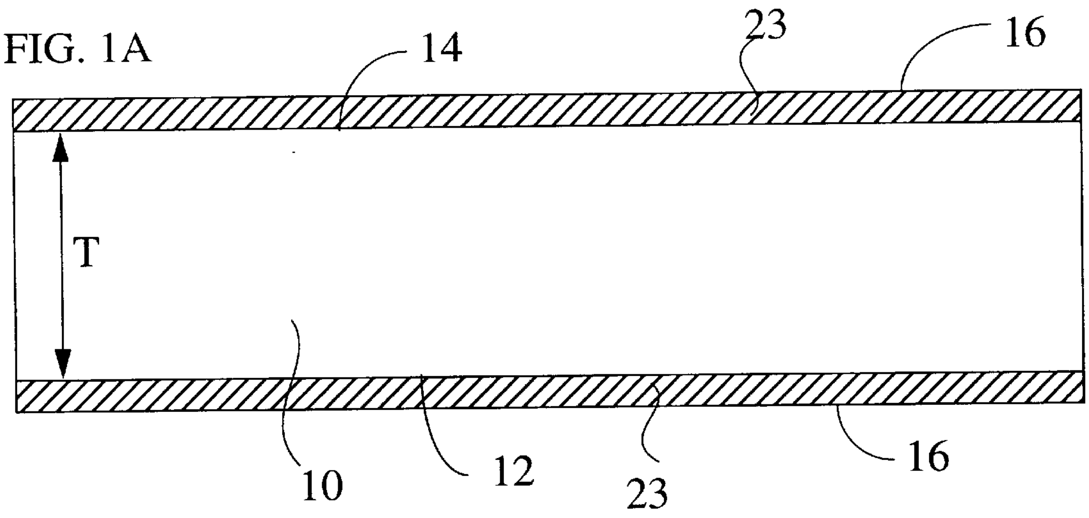
FIGS. 1A, 1B, 1C, 1D, 1E and 1F are cross-sectional views of a single layered substrate wafer at various stages during the fabrication of a field emitter tip according to a first embodiment of the invention.
Figure 1B:
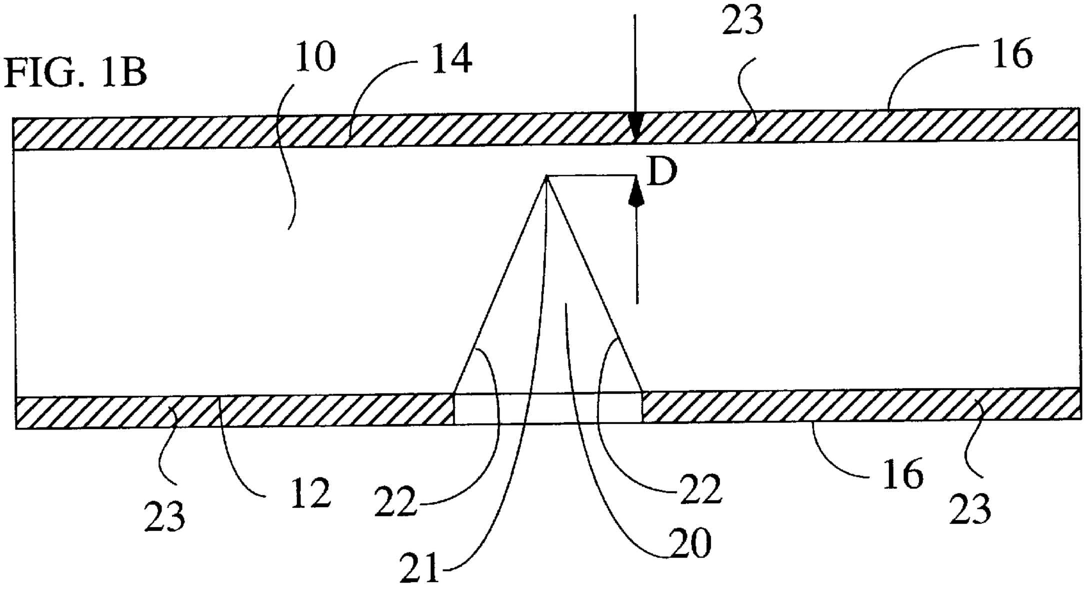
Figure 1C:
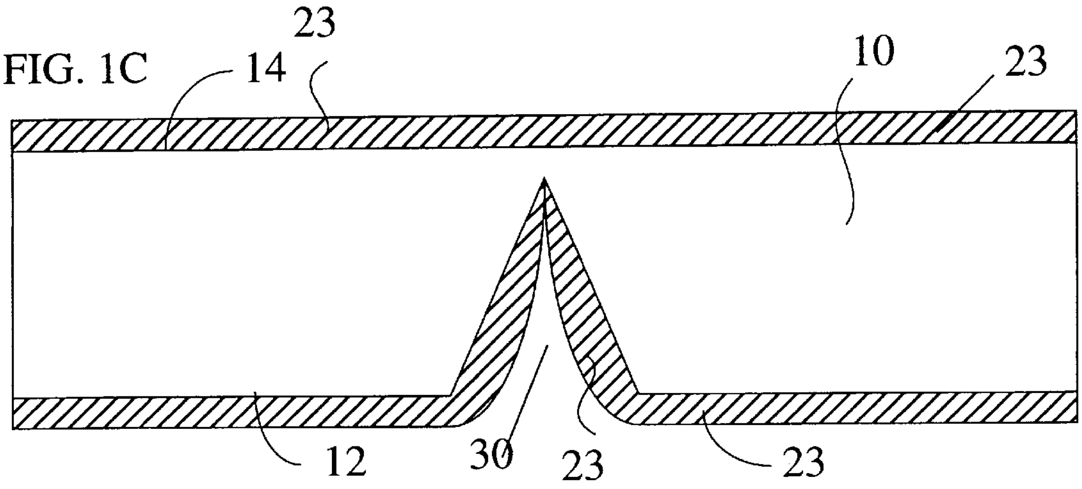
Figure 1D:
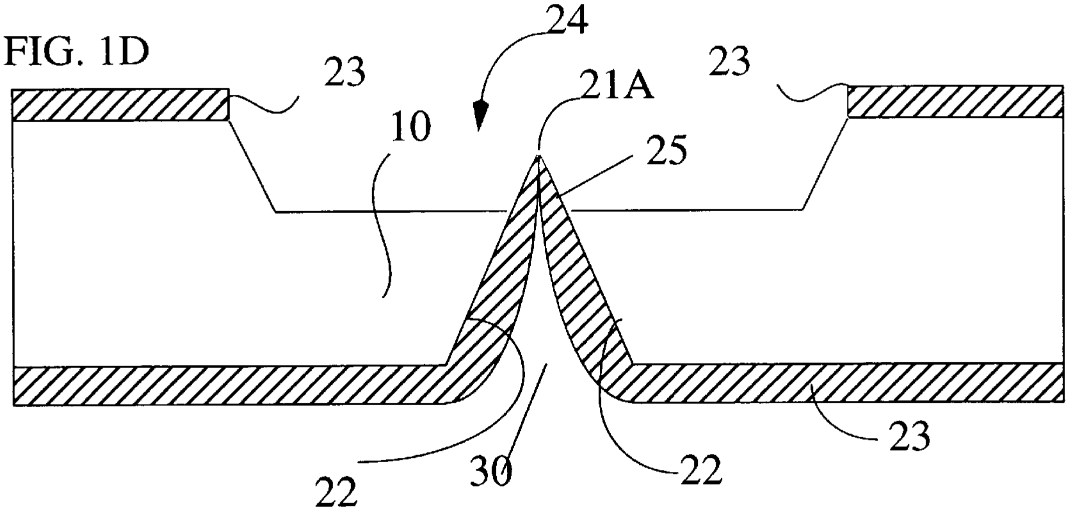
Figure 1E:
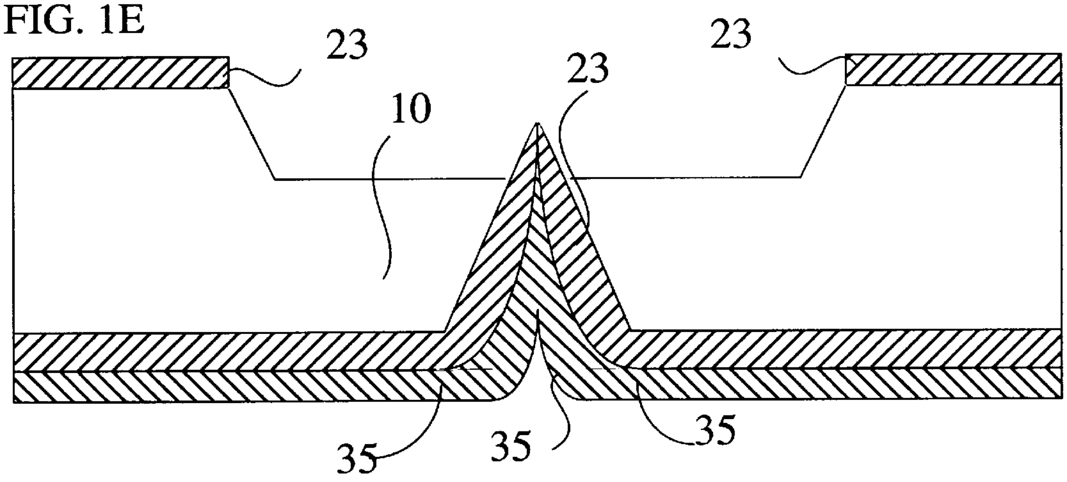
Figure 1F:
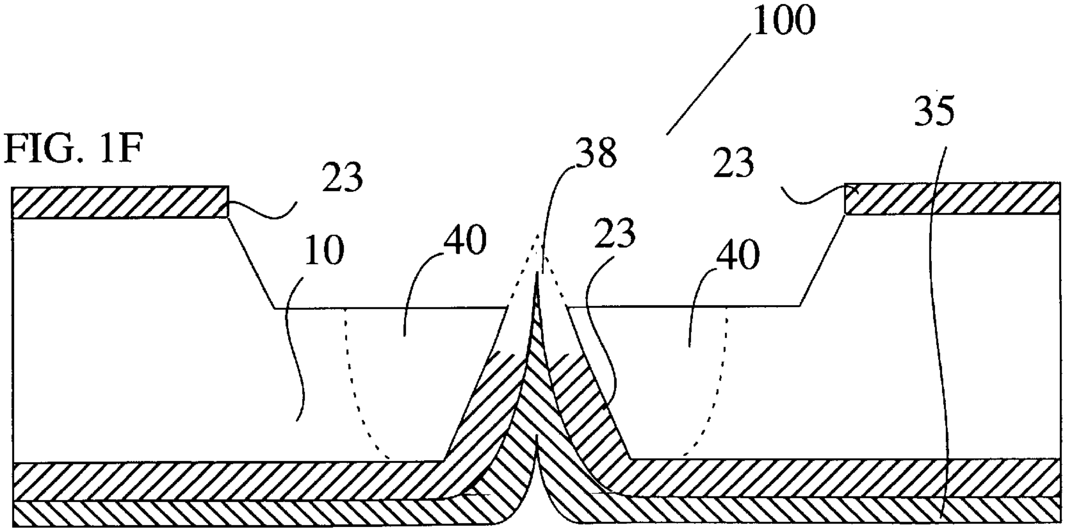

FIGS. 1A through 1F and 5 illustrate a method for forming the field emission structure 100 of FIG. 1F. The process begins by providing a wafer 10 of a single crystal substrate material (step 500). The substrate material is preferably single crystal (100) oriented silicon. This crystal orientation facilitates the formation of prismatic cavities by anisotropic etching as described below. Wafer 10 has a first face 12, a second face 14 and a thickness T. Wafer 10 may have any convenient diameter and thickness. As shown in FIG. 1A, a passivation layer 16 is provided on each of first face 12 and second face 14. Passivation layer 16 may be provided, for example, by cleaning wafer 10 in accordance with known standard techniques and then passivating wafer 10 to produce a thin (e.g. 0.5$\mu$ meter thick) passivation layer 16. Passivation layer 16 may, for example, be a film of silicon dioxide obtained by the thermal oxidation method in ways known to those skilled in the art.

The first step in the method is to form a prismatic cavity 20 in first face 12 (FIG. 1B, step 510). This can be accomplished by selectively applying a mask to wafer 10 leaving unmasked areas (or "windows") in places where a cavity 20 is desired. The unmasked areas are preferably square in shape. Any known masking technique may be used. For example, a layer of photoresist may be applied to passivation layer 16 on first face 12 of wafer 10. The photoresist is then exposed and developed to provide a mask having at least one window located at a point where it is desired to form a field emission structure (step 512). An array of field emission structures may be fabricated simultaneously by exposing the photoresist so that multiple windows are provided Next, those portions of passivation layer 16 not protected by the resist mask (i.e. those portions of passivation layer 16 in the windows) are etched away by any well-known technique, to result in the mask structure. The developed resist may then be removed by any known means.

Cavity 20 is conveniently formed by anisotropically etching the substrate material of wafer 10 (step 515). Portions of faces 12 and 14 of wafer 10 which are protected by passivation layer 16 are not etched. Methods for forming cavity 20, including suitable etchants and process conditions, are known to those skilled in the art. In this specification an "anisotropic" etch is an etch which etches significantly faster in one crystal direction than in other crystal directions. For example, an etchant such as tetramethylammonium hydroxide (TMAH) or ethylenediamine pyrocatechol solution (EDP) and water may be used to preferentially attack the (100) planes of substrate material consisting of n-type silicon or low or moderately doped p-type silicon. Such an anisotropic etch attacks (100) planes of silicon substrate material at a rapid rate until (111) planes are encountered. The etching then stops or is at least significantly slowed down. This etching action tends to produce a pyramidal hole whose sides 22 are defined by (111) planes in the silicon substrate. Sides 22 therefore intersect at a crystallographically sharp point 21.

It will be noted that where several cavities 20 are being formed simultaneously by anisotropic etching then all of the cavities 20 will have sharp points 21 if the anisotropic etching step 515 is continued long enough. At most, further etching will make individual cavities 20 deeper if the etch is merely slowed down and not stopped when (111) planes are encountered.

Cavities 20 penetrate wafer 10 to a depth such that their points 21 are at a first distance D beneath second face 14. The average depth of cavities 20 can be determined by the size of the unmasked windows used, the relative etch rates of (100) planes and (111) planes, the etchant being used and the duration of the anisotropic etching process. After cavities 20 are etched then passivation layer 16 is removed from both faces 12, 16 of wafer 10 by any suitable technique (step 520).

The next step 530 covers both faces of wafer 10 with a thick passivation layer 23 as shown in FIG. 1C. Passivation layer 23 may be a thermal oxidation layer. The thickness of passivation layer 23 will determine the spacing between the gate electrode and the tip in field emission structure 100. Passivation layer 23 covers the walls 22 of cavity 20 to define a cusp-shaped tapered tip mold 30 inside cavity 20.

Step 530 may comprise, for example, forming a compressively stressed passivation layer 23 of silicon dioxide in cavity 20 by exposing wafer 10 to an oxidizing atmosphere (e.g. an atmosphere containing an oxidizing species such as oxygen or steam), at a temperature sufficient to form an oxide layer with differential thickness (e.g. a temperature in the range of 850° C. to 1,000° C.). The thickness of passivation layer 23 on cavity walls 22 varies so that the walls of tip mold 30 are convex. The thickness of passivation layer 23 is typically in the range of 500 Angstroms to 10,000 Angstroms.

Next substrate material is removed from second face 14 of wafer 10 in an area 24 opposed to cavity 22 (step 540) to yield the structure shown in FIG. 1D. In step 540 the substrate material is removed to a depth greater than first depth D and less than the thickness T of wafer 10. Step 540 therefore exposes a portion 25 of passivation layer 23 at the point 21 of cavity 20 but does not remove all of the substrate material of wafer 10 from around cavity 20. If desired the order of steps 530 and 540 may be reversed, as described below with reference to FIGS. 4A through 4E.

The progress of step 540 can be monitored by shining a light on first face 12 of wafer 10. When step 540 has progressed to the point that cavities 20 are exposed from second face 14, a small point of light can be seen on second face 14 at the location of each cavity 20. The dimensions of the points of light (e.g. the dimensions of the aperture formed by the intersection of cavity 20 and second face 14 may be monitored and step 540 terminated when the apertures are a desired size.

Step 540 may comprise forming a window in the passivation layer 23 on second face 14 of wafer 10. A suitable window may be formed by applying and developing a photoresist mask as described above. Second face 14 is then etched away until the point 21A of oxide tip mold 30 becomes visible. The window must be generally aligned with point 21A of tip mold 30 but the alignment is not critical. As long as point 21A is in a central region of the window a suitable field emission structure 100 can be fabricated.

Next, in step 550, tip mold 30 is filled with a conductive material 35 capable of ionization and/or emission under the influence of an electric field as shown in FIG. 1E. Material 35 is deposited on top of passivation layer 23 and fills tip mould 30 to yield a sharp field emission tip 38. Material 35 may be any conductive material capable of emitting electrons under the influence of an electric field but is preferably selected from the group consisting of silicon nitride, polysilicon, aluminum, gold, tungsten and iridium. Material 35 may be deposited by any suitable method including the following deposition techniques: sputtering, chemical vapor deposition, electro or electroless plating, oxidation, evaporation, sublimation, plasma deposition, anodization, anodic deposition, molecular beam deposition or photodeposition. Electroplating, electroless plating or sputtering are preferred because they are more inexpensive to practice than some other techniques.

After conductive material 35 has been deposited then the portion of tip mold 30 protruding on second face 14 is removed (step 560) using, for example, a suitable chemical etchant to leave the structure 100 shown in FIG. 1F. Structure 100 has a sharp field emitter tip 38 spaced apart from and electrically insulated from wafer 10 by passivation layer 23. A region 40 of wafer 10 surrounding tip 38 can serve as a gate electrode. Region 40 is automatically aligned with tip 38. The spacing between region 40 and tip 38 is determined by the thickness of passivation film 23 and is not affected by the alignment of masks etc. Tip mold 30 protects tip 38 until it is removed in step 560.

An important feature of the invention for some applications is that the invention does not require tip 38 to be coplanar with gate electrode 40. Tip 38 can be made to project past gate electrode 40 by increasing the depth to which second face 14 is etched in step 540. Tip 38 can be made recessed relative to gate electrode 40 by using a thicker passivation layer 23 and stopping the etching in step 540 as soon as the tip 21A of tip mold 30 becomes visible.

Figure 2A:
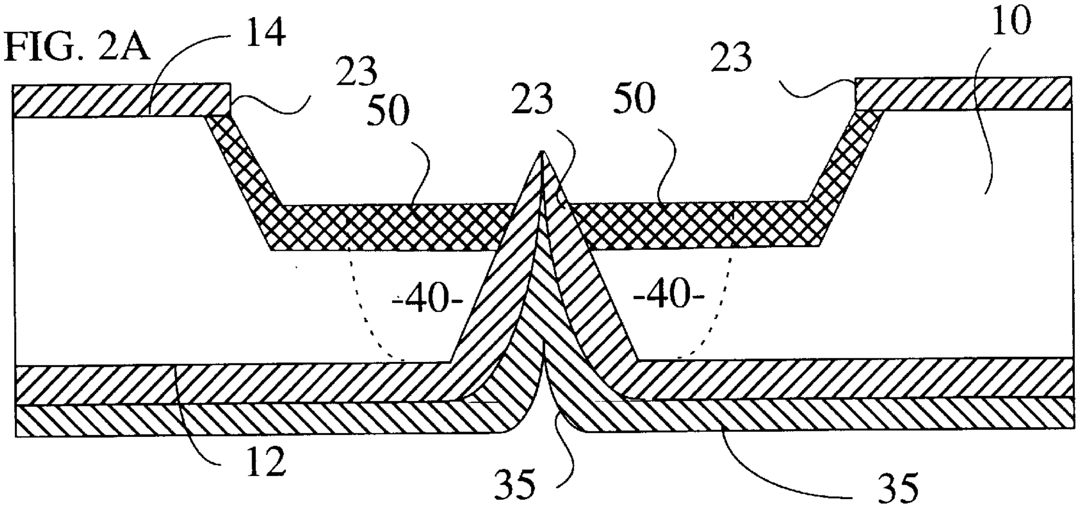
FIGS. 2A and 2B are cross-sectional views of a single layered substrate wafer in the final stages of fabricating a field emitter tip having an integrated doped semiconductor gate electrode according to a first alternative embodiment of the invention.
Figure 2B:
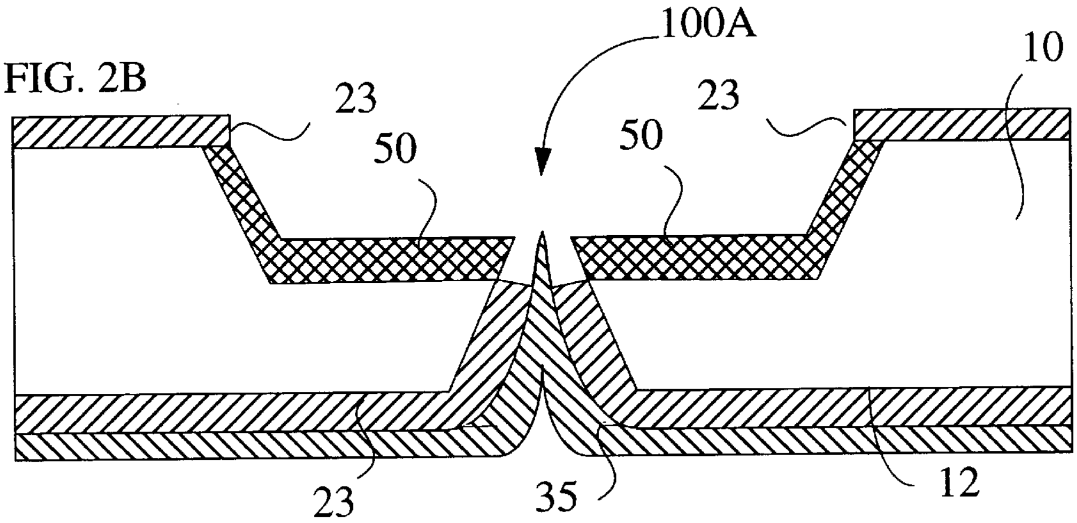

FIGS. 2A and 2B illustrate an alternative manner of proceeding from the stage depicted in FIG. 1C. In the method of FIGS. 2A and 2B the conductivity of gate electrode 40 is enhanced by doping (step 545) a region 50 of the substrate material of wafer 10 by diffusing a dopant into the substrate material of wafer 10 from second face 14 after step 540. Region 50 is preferably highly doped. After doping step 545 the method can be continued as described above with conductive material deposition step 550 and oxide tip mold removal step 560 to yield the structure 100A of FIG. 2B.

Figure 3A:
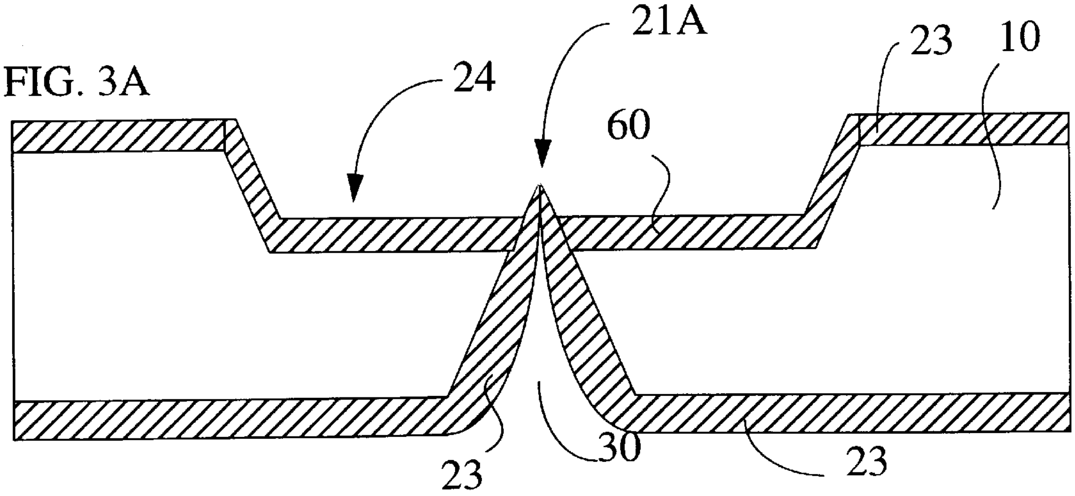
FIGS. 3A, 3B, 3C, and 3D are cross-sectional views of a single layered substrate wafer at several stages of fabricating a field emitter tip having an integrated metallic gate electrode according to a second alternative embodiment of the invention.

FIGS. 3A through 3D illustrate an alternative embodiment of the invention which provides a separate self-aligned gate electrode structure. The method of FIGS. 3A through 3D begins after step 540 described above. As shown in FIG. 3A, a passivation layer 60 is formed on the etched part of second face 14 (step 610). Passivation layer 60 is typically a thermally created silicon oxide layer and is typically as thick as practical.

Figure 3B:
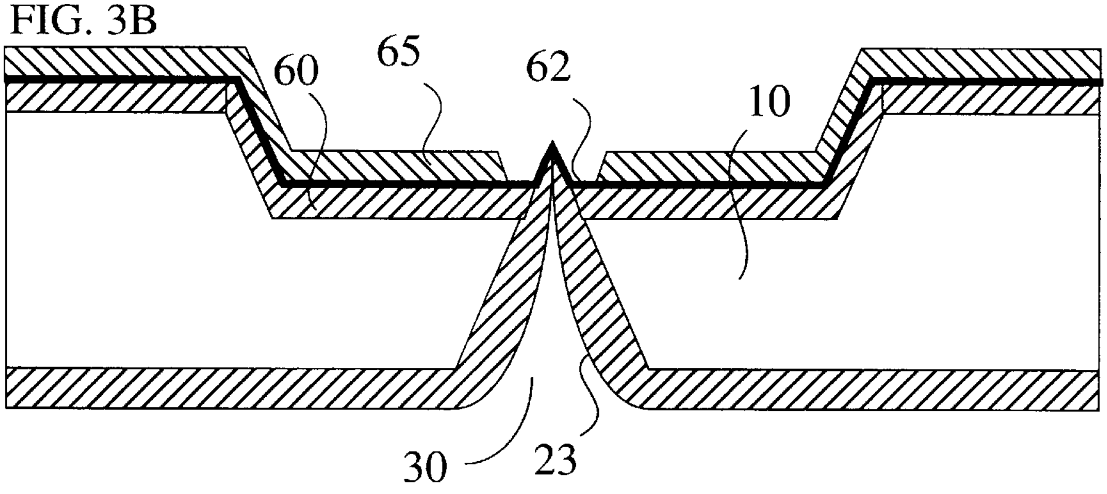
Figure 3C:
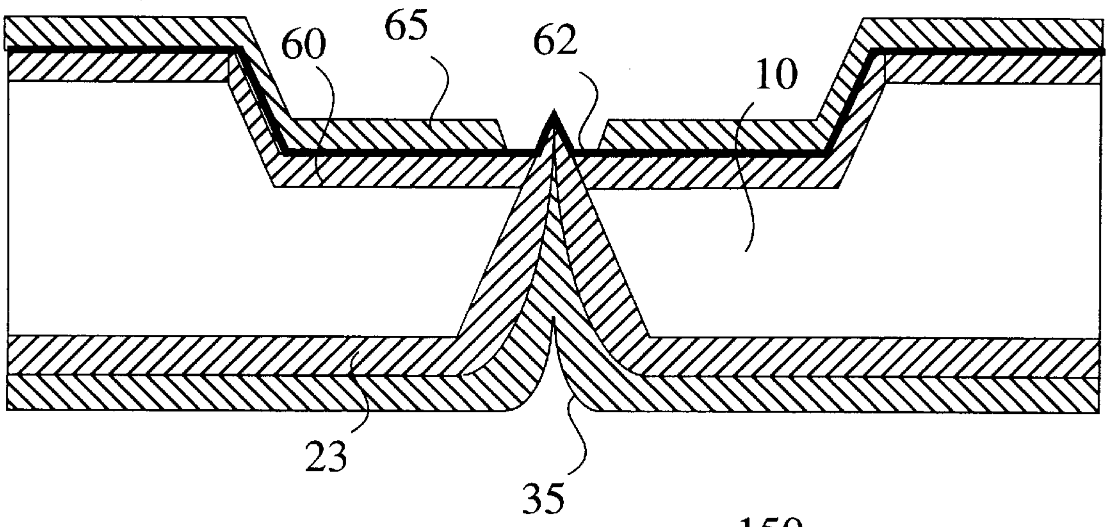
Figure 3D:
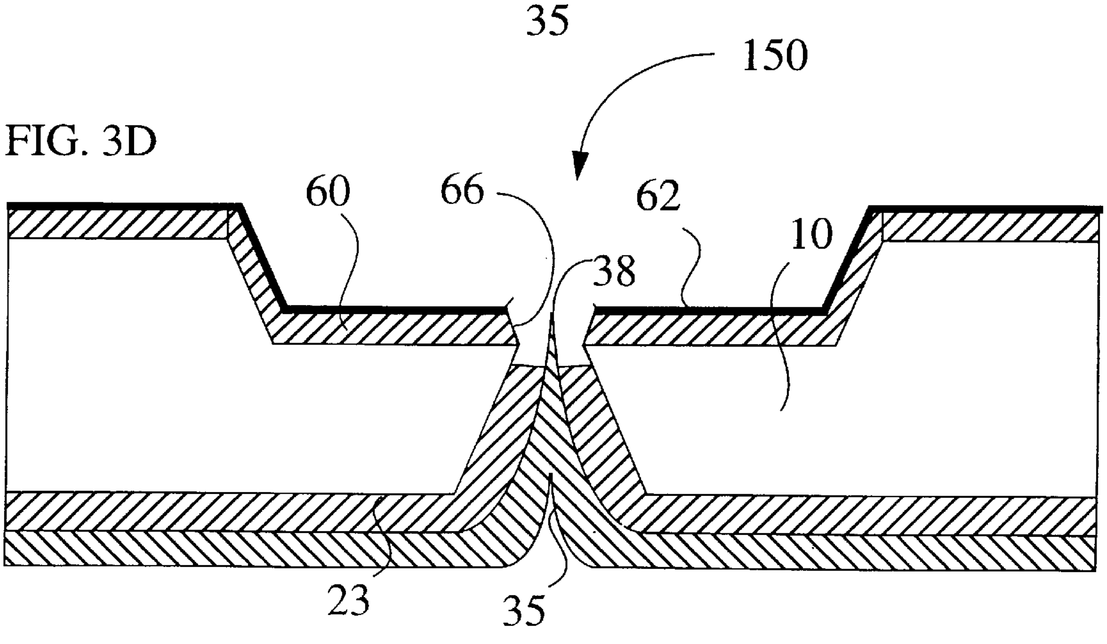

Then a thin layer of metal 62 is deposited atop passivation layer 60 (step 620) to yield the structure shown in FIG. 3B. Layer 62 is thin enough that it is not opaque to ultraviolet (UV) light. Typically metal layer 62 is in the range of 10 nanometers to 100 nanometers thick. In this thickness range metal layer 62 is at least partially transparent to UV light.

Next, in step 630, a photoresist layer 65 is deposited on top of metal layer 62. Photoresist layer 65 comprises a UV light sensitive material. Wafer 10 is then exposed (step 635) to UV light on its first face 12. The UV light shines through cavities 20 passivation layer 23 and metal film 62 to expose photoresist layer 65 from its lower side. Only those portions of photoresist layer 65 immediately adjacent cavities 20 are exposed to the UV light. The substrate material of wafer 10 blocks the UV light from reaching other portions of photoresist layer 65. The result of step 635 is the structure of FIG. 3B.

Tip mold 30 is then filled with a conductive material as described above in step 550 to yield the structure of FIG. 3C. Finally the portion of metal film 62 exposed by photoresist 65 is etched away to provide an aperture 66 surrounding tip mold 30 (step 640), the exposed portion of silicon oxide tip mold 30 surrounding tip 38 is etched away (step 645) and the photoresist layer 65 is removed (step 650) to yield the field emission structure 150 of FIG. 3D. Structure 150 has a sharp field emitter tip 38 which is self aligned with a gate electrode formed by metal film 62. The alignment of aperture 66 with tip 38 does not depend upon the accurate alignment of any masks.

Figure 4A:
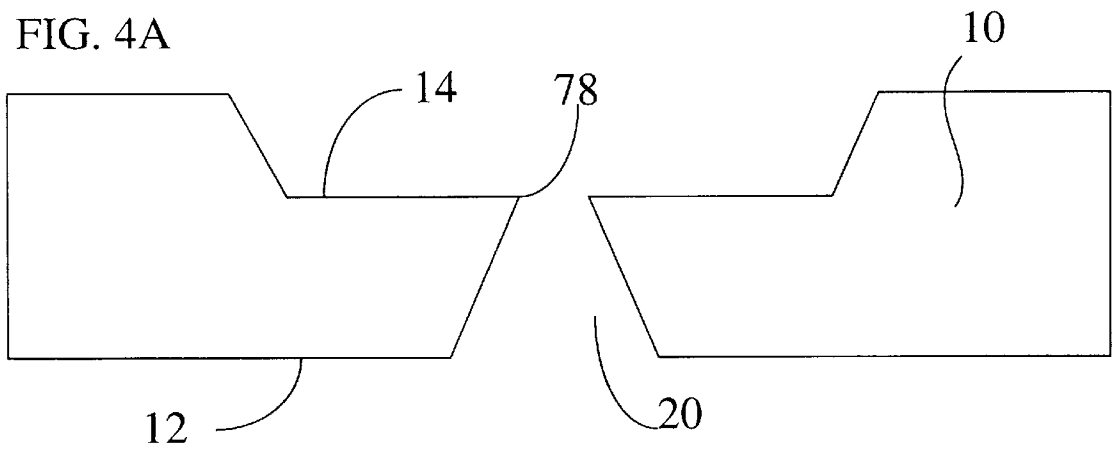
FIGS. 4A, 4B, 4C, 4D, and 4E are cross-sectional views of a single layered substrate wafer at several stages of fabricating a field emitter tip according to a third alternative embodiment of the invention.
Figure 7:
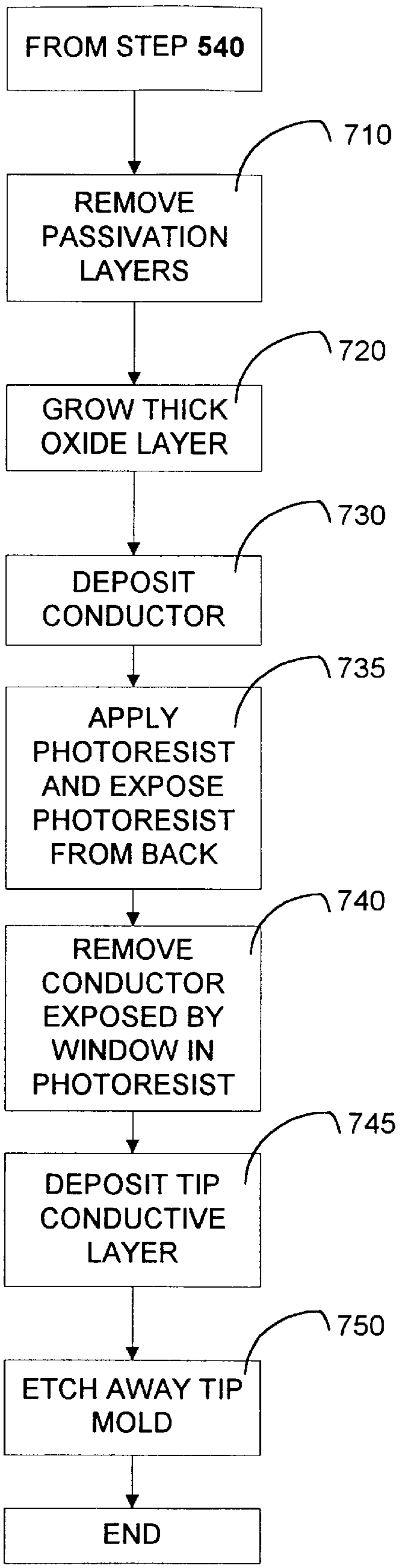
FIG. 7 is a flow diagram illustrating the sequence of steps in fabricating the field emitter tip of FIGS. 4A through 4E; and, FIGS. 8A, 8B and 8C are sections through a wafer at several sequential stages in the creation of a tip mold in the alternative method illustrated in FIGS. 4A through 4E.

FIGS. 4A through 4E and 7 illustrate steps which may be used in the methods of the invention to provide field emitter tips of increased sharpness. The starting point for the steps of FIG. 7 is the structure of FIF. 1D. In step 710 silicon dioxide passivation layers are removed from wafer 10 with a suitable etchant, such as a suitable buffered oxide etchant, to yield the structure shown in FIG. 4A. In the structure of FIG. 4A, cavity 20 intersects second face 14 of wafer 10 at an aperture 78. Aperture 78 has sharp edges at its intersection with second face 14.

Figure 4B:
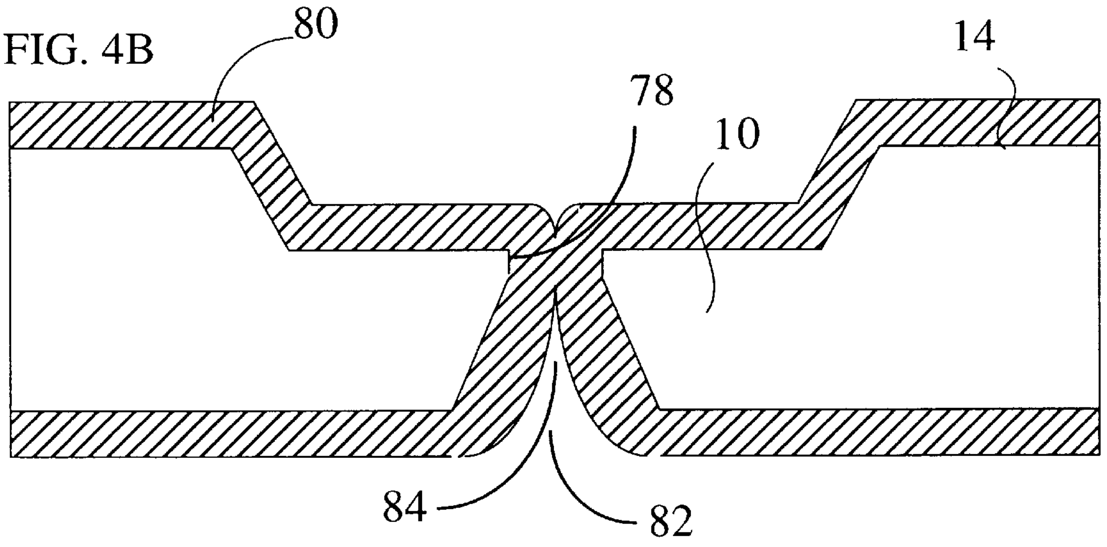
Figure 8A:
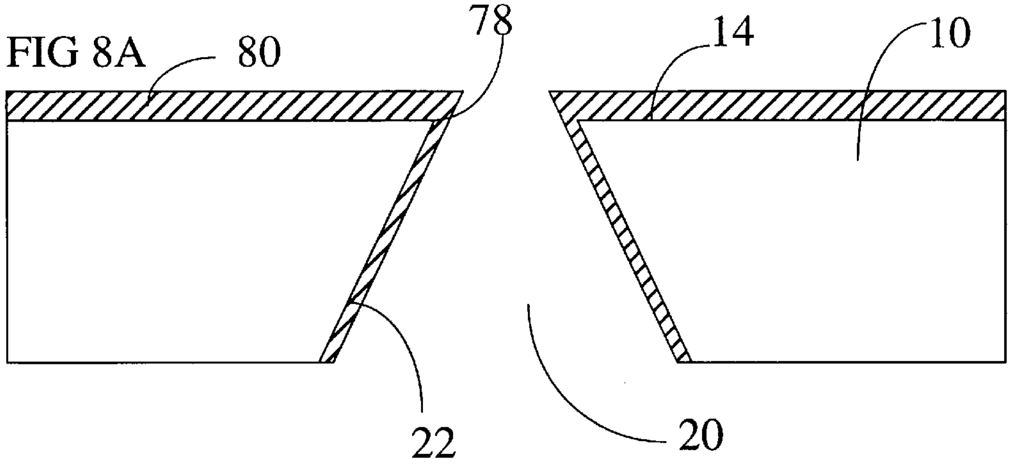
Figure 8B:
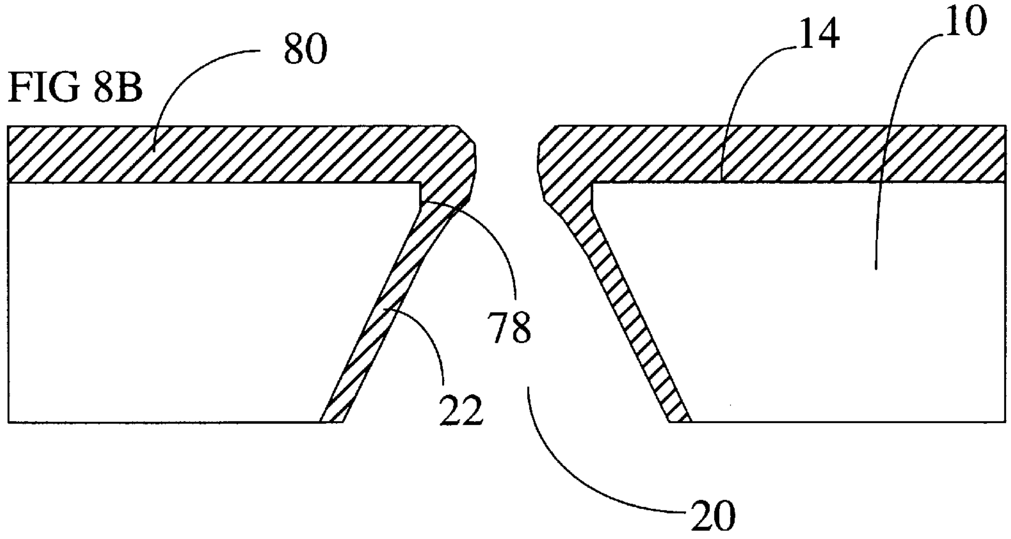
Figure 8C:
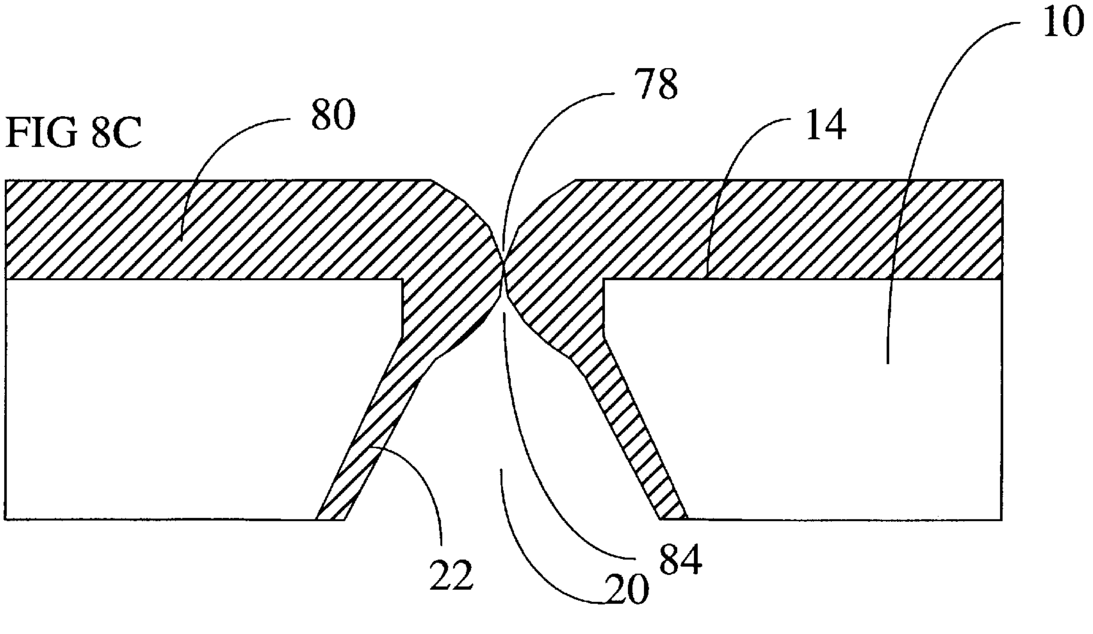

Next, in step 720 a thick layer of silicon dioxide is grown on the surface of wafer 10 by, for example, thermal oxidation. Silicon dioxide layer 80 covers exposed surfaces of wafer 10. FIGS. 8A through 8C show wafer 10 at several stages of oxidation step 720. Step 720 is continued until layer 80 is so thick that it closes aperture 78. The result is a cusped tip mold 82 as shown in FIG. 4B.

The geometry of the structure of FIG. 4A is such that layer 80 tends to form a very sharp cusp 84 in the vicinity of aperture 78 even if the edges of aperture 78 are rounded somewhat during the formation of layer 80. Cusp 84 tends to be somewhat sharper than the cusp of tip mold 30 of FIG. 3B because oxide layer 80 grows more rapidly in the vicinity of sharp corner 79 than it does on the {111} planes which make up walls 22 of cavity 20. As shown in FIGS. 8B and 8C, this differential growth rate of oxidation film 80 results in a very sharp cusped area 84.

After oxidizing step 720 a thin layer 62 of a conductor, which is preferably a metal, is applied to the surface of layer 80 on the second face 14 of wafer 10 (step 730). Layer 62 is at least partially transparent to UV light. Layer 62 may comprise, for example, a film of metal having a thickness in the range of 10 nanometers to 100 nanometers.

Figure 4C:
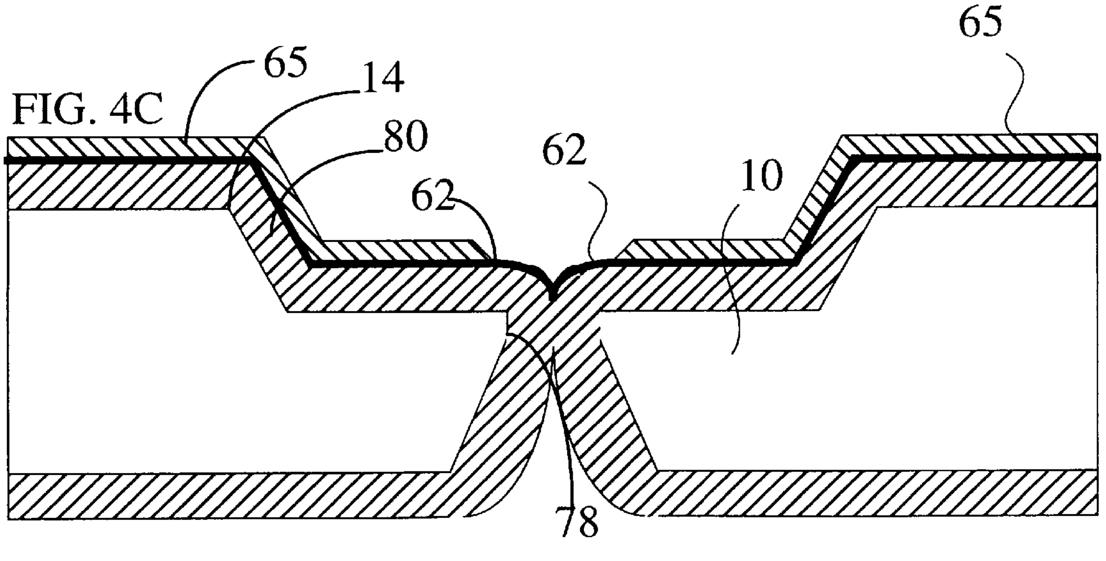

A photoresist 65 is deposited atop layer 62. Photoresist 65 is exposed to UV light from the direction of first face 12 (step 735) as described above in relation to step 630. The UV light passes through layer 80 and layer 62 to expose photoresist layer 65 from below. Only the portion of photoresist layer 65 adjacent aperture 78 is exposed. The exposed portions of photoresist layer 65 are then removed to leave a mask which is self aligned with aperture 78. The result is a structure as shown in FIG. 4C.

In step 740 the unmasked portion of conductor film 62 is removed and photoresist layer 65 is removed. The remaining portions of layer 62 provide a gate electrode structure 89 surrounding aperture 78 (which is still plugged with oxide layer 80).

Figure 4D:
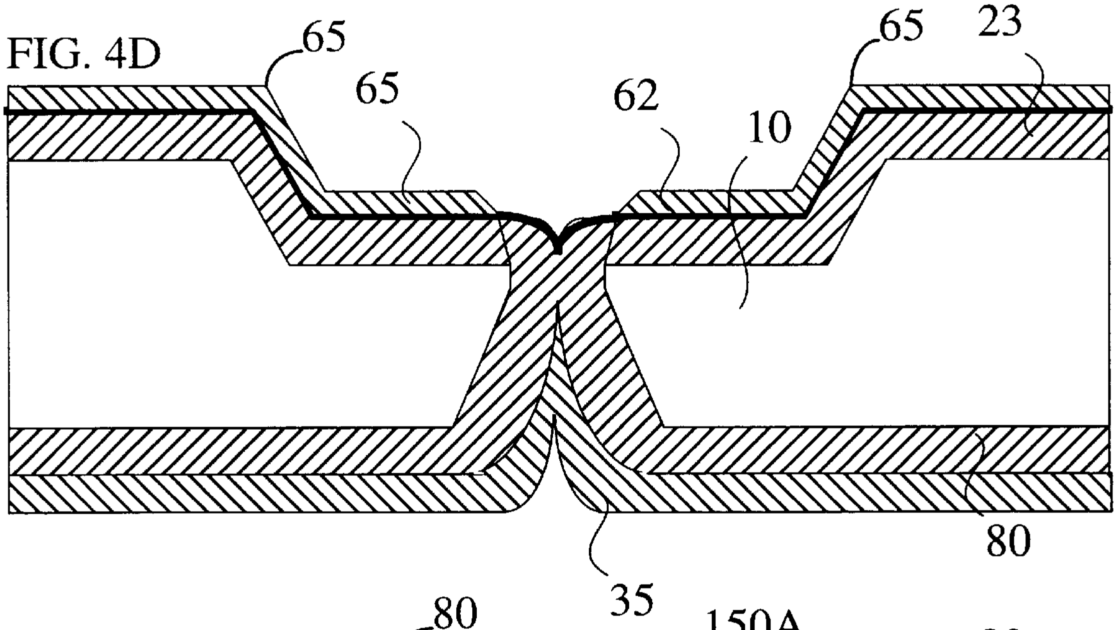

Next, in step 745, a layer 35 of a conductive material is deposited so as to fill tip mold 82 as shown in FIG. 4D. The deposited material layer 35 extends into cusp 84 to provide a sharp tip 94. The material of layer 35 may be any compatible material capable of emission or ionization under the influence of an electric field and may comprise a suitable metal or semiconductor. The material of layer 35 is preferably selected from the group consisting of silicon nitride, polysilicon, aluminum, gold, tungsten and iridium.

Figure 4E:
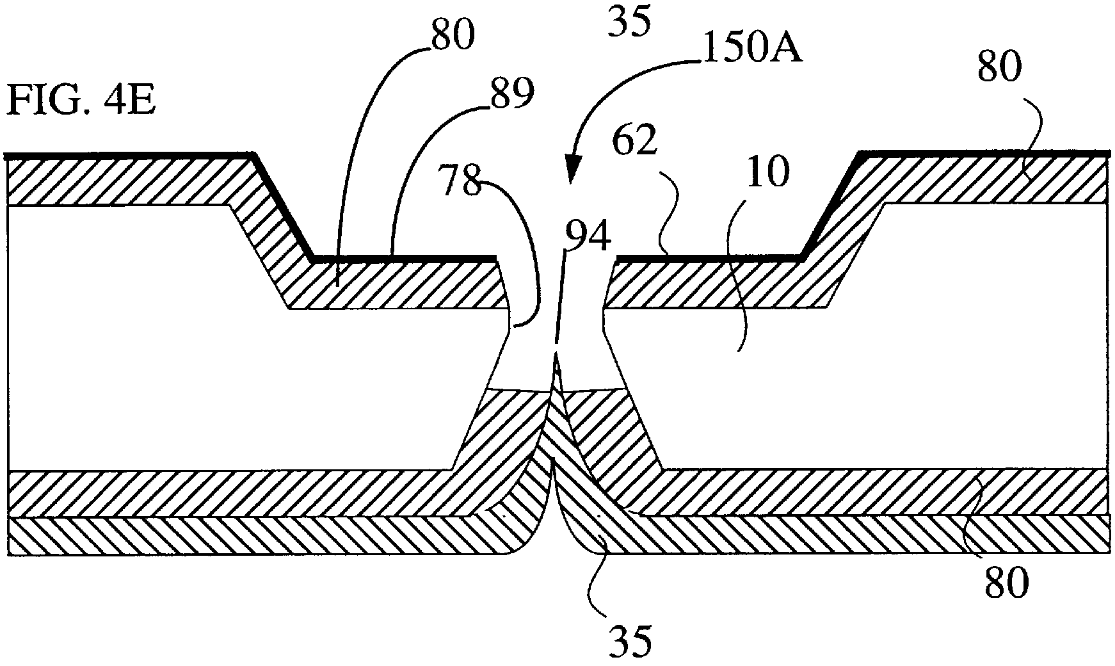
Figure 5:
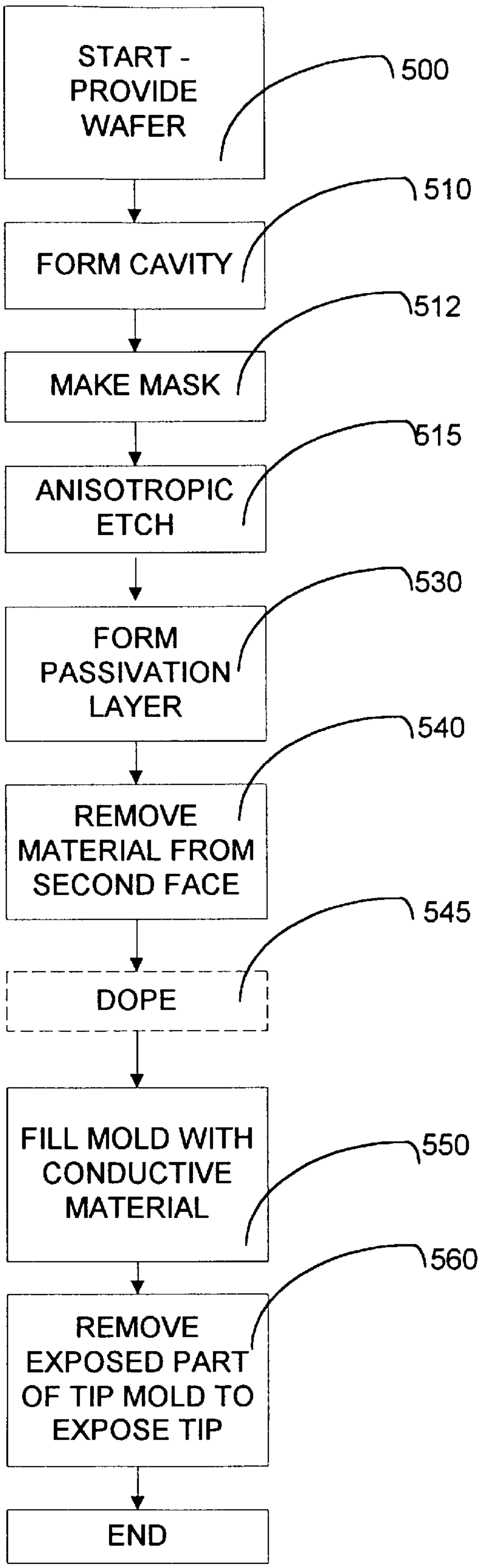
FIG. 5 is a flow diagram illustrating the sequence of steps in fabricating the field emission structure of FIGS. 1A through 1F and FIGS. 2A and 2B.
Figure 6:
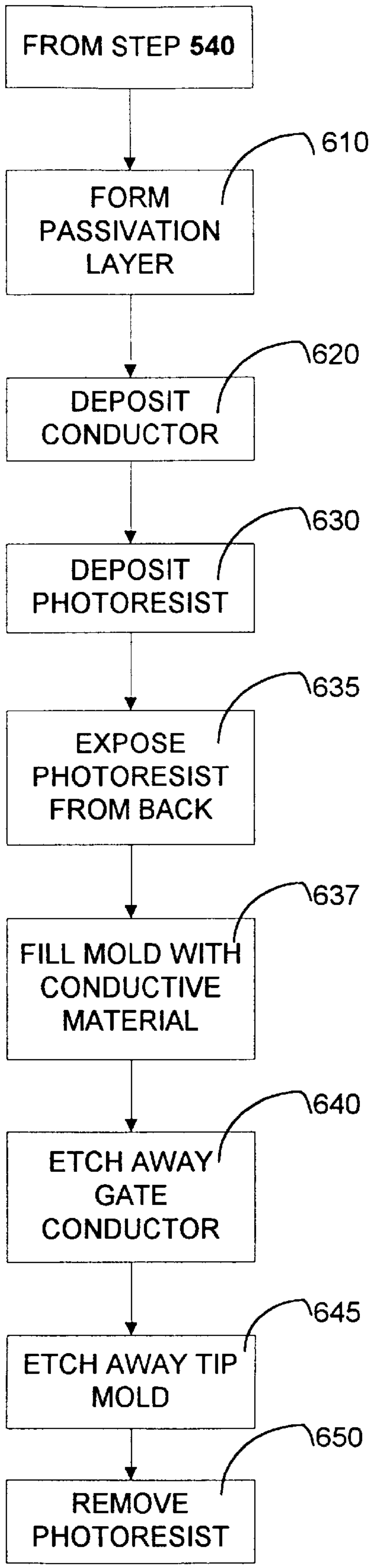
FIG. 6 is a flow diagram illustrating the sequence of steps in fabricating the field emission structure of FIGS. 3A through 3D.

Finally, in step 750 the exposed portions of layer 80 which encase tip 94 are etched away, for example, by using a suitable chemical etchant, to leave the structure shown in FIG. 4E. Tip 94 is automatically aligned with gate electrode structure 89.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method for forming a microminiature tip and a gate self-aligned with the tip, the method comprising the steps of:

(a) providing a substrate of a single crystal substrate material, the substrate having first and second faces and a thickness;

(b) forming a prismatic cavity having a sharp point in the first face of the substrate, the cavity point at a first depth below the second face of the substrate;

(c) forming a tip mold by oxidizing the substrate to form an oxide layer on walls of the cavity and removing substrate material from the second face of the substrate in an area opposed to the cavity to a depth greater than the first depth and less than the thickness of the substrate;

(d) filling the tip mold with a material capable of emitting electrons under the influence of an electric field to yield a tip encased in the oxide layer; and, (e) removing a portion of the oxide layer to expose the tip.

2. The method of claim 1 wherein the substrate material is silicon.

3. The method of claim 2 further comprising extending an electrical connection to a gate region of the substrate material surrounding the tip.

4. The method of claim 2 further comprising the step of forming an integrated gate electrode structure by doping a doped region in the substrate material on the second face of the substrate with a dopant in a concentration sufficient to render the doped area electrically conducting, the doped region surrounding the tip mold.

5. The method of claim 2 wherein the step of oxidizing the substrate material comprises forming a compressively stressed layer of silicon dioxide in the cavity by exposing the silicon to an oxidizing species at a temperature in the range of 850° C. to 1,000° C. to provide a tip mold having convex walls.

6. The method of claim 2 wherein the step of removing substrate material from the second face of the substrate comprises removing an oxide layer from the second face of the substrate to expose the substrate material in a window aligned with the pit and performing an anisotropic etch on the exposed substrate material.

7. The method of claim 2 wherein the step of oxidizing the substrate comprises forming a layer of silicon dioxide having a thickness on the cavity walls in the range of 500 to 10,000 Angstroms.

8. The method of claim 2 wherein all of the walls of the tip mold are convex in shape and converge towards the bottom of said cavity.

9. The method of claim 2 further comprising forming a self-aligned gate electrode structure on the second face of the substrate by the steps of:

(i) depositing a thin light permeable layer of a conductor on the second face of the substrate;

(ii) depositing a photoresist on top of the layer of conductor;

(iii) selectively developing the photoresist by illuminating the first face of the substrate with light to produce an unmasked area coincident with the tip mold; and, (iv) removing the conductor in the unmasked area.

10. The method of claim 2 wherein the step of removing substrate material from the second face comprises illuminating the first face, removing substrate material from the second face by etching, and stopping the etching when a point of light on the second face at a location corresponding to one of the cavities reaches a desired size.

11. The method of claim 1 further comprising forming a self-aligned gate electrode structure on the second face of the substrate by the steps of:

(i) depositing a thin light permeable layer of a conductor on the second face of the substrate;

(ii) depositing a photoresist on top of the layer of conductor;

(iii) selectively developing the photoresist by illuminating the first face of the substrate with light to produce an unmasked area coincident with the tip mold; and, (iv) removing the conductor in the unmasked area.

12. The method of claim 11 a comprising forming an electrically insulating layer on the exposed etched substrate material before the step of depositing the thin layer of conductor and depositing the thin layer of conductor on the electrically insulating layer.

13. The method of claim 12 wherein the conductor comprises a metal having a thickness in the range of 10 nanometers to 100 nanometers.

14. The method of claim 12 wherein the electrically insulating layer comprises silicon dioxide.

15. The method of claim 1 wherein the step of defining the prismatic cavity includes the step of anisotropic etching the single crystal substrate.

16. The method of claim 1 wherein the tip material is selected from the group consisting of silicon nitride, polysilicon, aluminum, gold, tungsten and iridium.

17. A method for fabricating a field emission structure in a substrate, the method comprising the steps of:

(a) providing a substrate of a single crystal substrate material, the substrate having first and second faces and a thickness;

(b) forming a cavity on the first face of the substrate, the cavity penetrating through the substrate to an aperture on the second face of the substrate;

(c) placing the substrate in oxidizing conditions until a layer of oxide on the substrate blocks the aperture, the layer of oxide forming a cusped tip mold in the cavity; and (d) filling the tip mold with a material capable of emitting electrons under the influence of an electric field to yield a tip encased in the layer of oxide; and, (e) removing a portion of the layer of oxide to expose the tip on the second face of the substrate.

18. The method of claim 17 wherein the cavity is prismatic in shape.

19. The method of claim 18 wherein the substrate comprises (100) oriented silicon.

20. A method for fabricating a field emission structure having an integrated gate electrode structure, the method comprising the steps of:

(a) providing a wafer of a single crystal substrate material having first and second faces;

(b) forming an oxide tip mold in a cavity in the first face of the wafer, the oxide tip mold penetrating the second face of the wafer;

(c) applying a conductive film on the second face of the wafer, the film non opaque to electromagnetic radiation of a first frequency;

(d) applying a layer of photoresist on the conductive film, the photoresist sensitive to electromagnetic radiation of the first frequency;

(e) exposing the photoresist by shining electromagnetic radiation of the first frequency on the first face of the wafer and allowing the electromagnetic radiation to pass through the tip mold and the conductive film to expose a window in the photoresist aligned with the tip mold;

(f) removing the conductive film exposed in the window;

(g) depositing a conductive material capable of emitting electrons in the tip mold; and, (h) removing a portion of the tip mold to expose a sharp tip of the conductive material.

21. The method of claim 20 wherein the substrate material comprises (100) oriented silicon.

22. The method of claim 21 wherein the electromagnetic radiation comprises ultraviolet light.

23. The method of claim 22 wherein the conductive film comprises a film of a compatible metal having a thickness in the range of 10 nanometers to 100 nanometers.

24. The method of claim 23 wherein the conductive material comprises a material selected from the group consisting of silicon nitride, polysilicon, aluminum, gold, tungsten and iridium.

25. The method of claim 24 including the step of forming an electrically insulating layer on the substrate material before the step of applying the conductive film whereby the conductive film is electrically insulated from the substrate material by the electrically insulating layer.

26. The method of claim 25 wherein the electrically insulating layer comprises an oxidation layer.

* * * * *